(12) United States Patent
Park et al.

(10) Patent No.: US 7,263,883 B2
(45) Date of Patent: Sep. 4, 2007

(54) GYRO-SENSOR COMPRISING A PLURALITY OF COMPONENT UNITS, AND FABRICATING METHOD THEREOF

(75) Inventors: Tae-sik Park, Suwon-si (KR); Moon-chul Lee, Suwon-si (KR); Chang-youl Moon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/141,054

(22) Filed: Jun. 1, 2005

(65) Prior Publication Data

US 2005/0262941 A1    Dec. 1, 2005

(30) Foreign Application Priority Data

Jun. 1, 2004    (KR)    ...................... 10-2004-0039680

(51) Int. Cl.
  *G01P 1/02*    (2006.01)
(52) U.S. Cl. .......................................... 73/493; 73/431
(58) Field of Classification Search .................. 73/493, 73/504.12; 257/414–417, 120, 127, 674–698, 257/774–778
  See application file for complete search history.

(56) References Cited

U.S. PATENT DOCUMENTS

| 5,831,162 | A | 11/1998 | Sparks et al. |
| 6,140,144 | A * | 10/2000 | Najafi et al. .................. 438/53 |
| 6,225,145 | B1 * | 5/2001 | Choi et al. .................. 438/120 |
| 6,316,840 | B1 * | 11/2001 | Otani .......................... 257/787 |
| 6,335,224 | B1 * | 1/2002 | Peterson et al. ............ 438/114 |
| 6,391,673 | B1 * | 5/2002 | Ha et al. ....................... 438/51 |
| 6,441,481 | B1 * | 8/2002 | Karpman .................... 257/711 |
| 6,753,205 | B2 * | 6/2004 | Halahan ..................... 438/107 |
| 6,810,736 | B2 * | 11/2004 | Ikezawa et al. .............. 73/493 |
| 6,888,233 | B2 * | 5/2005 | Horning et al. ............ 257/684 |
| 6,979,873 | B2 * | 12/2005 | Fujii .......................... 257/417 |
| 2003/0087469 | A1 | 5/2003 | Ma |

FOREIGN PATENT DOCUMENTS

| EP | 1 014 094 A1 | 6/2000 |
| EP | 1 118 836 A2 | 7/2001 |
| WO | 2004022477 A1 | 3/2004 |

* cited by examiner

*Primary Examiner*—Helen Kwok
(74) *Attorney, Agent, or Firm*—Sughrue Mion, PLLC

(57) ABSTRACT

Provided are a gyro-sensor including a plurality of component units and a method of fabricating the gyro-sensor. The gyro-sensor includes: a substrate; a micro electro mechanical system structure including a surface including a predetermined area in which a cavity is formed and connected to an upper surface of the substrate to output a vibration signal proportional to an external rotation force; and a circuit unit positioned in the cavity, converting the vibration signal into a predetermined electric signal proportional to a circular angular velocity, and outputting the predetermined electric signal.

9 Claims, 6 Drawing Sheets

GYRO-SENSOR COMPRISING A PLURALITY OF COMPONENT UNITS, AND FABRICATING METHOD THEREOF

CROSS-REFERENCE TO RELATED APPLICATIONS

This application claims the benefit of Korean Patent Application No. 2004-39680, filed on Jun. 1, 2004, in the Korean Intellectual Property Office, the disclosure of which is incorporated herein by reference.

BACKGROUND OF THE INVENTION

1. Field of the Invention

The present invention relates to a single chip including a plurality of elements and a method of fabricating the same, and more particularly, to a subminiature single chip fabricated on a single substrate by fabricating a predetermined cavity in one of a plurality of elements and then positioning another element in the cavity, and a method of fabricating the same.

2. Description of the Related Art

Recent developments in electronic technology have resulted in electronic devices that have various and excellent functions and that are compact and light. In particular, such electronic devices have been made compact and light more rapidly due to advances in Micro Electro Mechanical System (MEMS) technology. In MEMS technology electrical and mechanical components are made on a single micro body. In other words, MEMS technology combines micro scale mechanical and electrical structures to fabricate a system having a new function.

A plurality of structures and a plurality of circuit units fabricated using such MEMS technology can be interconnected to develop various types of single chips.

FIGS. 1A and 1B are views illustrating the structure of a gyro-sensor as an example of such a single chip in which a plurality of structures and a plurality of circuit units are disposed on a plane. In other words, FIG. 1A is a plan view of a gyro-sensor, and FIG. 1B is a cross-sectional view of the gyro-sensor shown in FIG. 1A.

The gyro-sensor is an apparatus which detects a circular angular velocity using a principle of generating a Coriolis force in a third axis direction orthogonal to first and second axis directions by receiving a rotation force of a constant angular velocity in the second axis direction perpendicular to a mass uniformly vibrating in the first axis direction. In other words, when the mass rotates toward the third axis direction due to the Coriolis force, the gyro-sensor changes the displacement of the mass into a variation in capacitance to detect the circular angular velocity. Thus, the gyro-sensor requires a mass vibrating in a predetermined direction and a sensing electrode to generate and sense the Coriolis force. The mass and the sensing electrode can be fabricated using MEMS technology.

Referring to FIG. 1A, in the gyro sensor, a MEMS structure 11, an analog Application Specific Integrated Circuit (ASIC) 12, and a digital ASIC 13 are disposed on a substrate 10 in a predetermined pattern. The MEMS structure 11 includes a mass, a sensing electrode, and the like. The analog ASIC 12 detects a variation in capacitance from the MEMS structure 11 and converts the variation into an analog voltage signal proportional to a circular angular velocity. Thus, the digital ASIC 13 converts the analog voltage signal output from the analog ASIC 12 into a digital signal and outputs the digital signal to the outside.

FIG. 1B is a cross-sectional view of the gyro-sensor shown in FIG. 1A. Referring to FIG. 1B, the MEMS structure 11 is electrically coupled to the analog ASIC 12 via conductive materials 14.

In the gyro-sensor shown in FIGS. 1A and 1B, various structures and circuit units are disposed on a plane. Thus, the whole area of the single chip increases. Therefore, the gyro-sensor is not suitable for the recent tendency toward miniaturization.

FIGS. 2A and 2B illustrate the structure of a conventional gyro-sensor including a stack of a MEMS structure 21, an analog ASIC 22, and a digital ASIC 23. Referring to FIG. 2A, the MEMS structure 21 is formed on a substrate 20, and various circuit units such as the analog and digital ASICs 22 and 23 are formed on the MEMS structure 21. Next, the MEMS structure 21, the analog ASIC 22, and the digital ASIC 23 are electrically coupled to one another via wires 24. FIG. 2B is a cross-sectional view of the gyro-sensor shown in FIG. 2A.

As shown in FIGS. 2A and 2B, the whole area of the gyro-sensor may be more reduced than that of the gyro-sensor in which elements are disposed on a plane. However, a plurality of elements are stacked, and then wire bonding is performed. Thus, the volume of the gyro-sensor is increased. Thus, the gyro-sensor is not suitable to be used in recent compact, light electric devices. Also, when the wire bonding is performed, loss of wires may occur.

SUMMARY OF THE INVENTION

Accordingly, the present general inventive concept has been made to address the above-mentioned disadvantages and/or problems, and an aspect of the present general inventive concept is to provide a single chip having a whole volume reduced by connecting and packaging a plurality of elements on a single substrate and a method of fabricating the same.

According to an aspect of the present invention, there is provided a gyro-sensor including: a substrate; a micro electro mechanical system structure including a surface including a predetermined area in which a cavity is formed and connected to an upper surface of the substrate to output a vibration signal proportional to an external rotation force; and a circuit unit positioned in the cavity, converting the vibration signal into a predetermined electric signal proportional to a circular angular velocity, and outputting the predetermined electric signal.

The circuit unit may include an analog application specific integrated circuit converting the vibration signal into a predetermined analog signal and a digital application specific integrated circuit converting the predetermined analog signal into a digital signal.

The micro electro mechanical system structure may be connected to the upper surface of the substrate so that the surface in which the cavity is formed faces the substrate.

The gyro-sensor may further include connectors electrically connecting the micro electro mechanical system structure and the circuit unit to the substrate. The connectors may be conductive bumps fabricated using a bumping method.

The micro electro mechanical system structure may be connected to the upper surface of the substrate so that the surface in which the cavity is formed faces a direction opposite to the substrate. The gyro-sensor may further include connectors electrically connecting the circuit unit to the cavity formed in the micro electro mechanical system structure. The connectors may be conductive bumps.

The micro electro mechanical system structure may include: a lower glass substrate including a surface including a predetermined area in which the cavity is formed; a silicon layer connected to a surface opposite to the surface of the lower glass substrate in which the cavity is formed and patterned in a predetermined vibration structure shape; a conductive layer formed on the lower glass substrate to be connected to the silicon layer; and an upper glass substrate connected to the silicon layer in an opposite direction to a direction along which the lower glass substrate is connected to the silicon layer.

According to another aspect of the present invention, there is provided a single chip including: a first element including a surface comprising a predetermined area in which a cavity is formed; a second element positioned in the cavity of the first element; and a substrate connected to the first and second elements via conductive materials to support the first and second elements.

According to still another aspect of the present invention, there is provided a method of fabricating a gyro-sensor, including: fabricating a micro electro mechanical system structure outputting a vibration signal proportional to an external rotation force; etching a predetermined area of a surface of the micro electro mechanical system structure to form a cavity; connecting a circuit unit converting the vibration signal into a predetermined electric signal proportional to a circular angular velocity and outputting the predetermined electric signal to an upper surface of a substrate; and connecting the micro electro mechanical system structure to the upper surface of the substrate to position the circuit unit in the cavity.

According to yet another aspect of the present invention, there is provided a method of fabricating a gyro-sensor, including: fabricating a micro electro mechanical system structure outputting a vibration signal proportional to an external rotation force; etching a predetermined area of a surface of the micro electro mechanical system structure to form a cavity; bonding a circuit unit converting the vibration signal into a predetermined electric signal proportional to a circular angular velocity and outputting the predetermined electric signal to the cavity; and connecting the micro electro mechanical system structure to an upper surface of a substrate.

Fabricating the micro electro mechanical system structure may include: bonding a silicon layer to a first glass substrate including a surface comprising an etched predetermined area; etching a predetermined area of the silicon layer to pattern the silicon layer in a predetermined vibration structure shape; bonding a second glass substrate including a space in which the predetermined vibration structure vibrates to the silicon layer; and stacking a conductive layer electrically connecting the silicon layer to an external terminal.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF EXEMPLARY EMBODIMENTS OF THE INVENTION

Figure 1A:
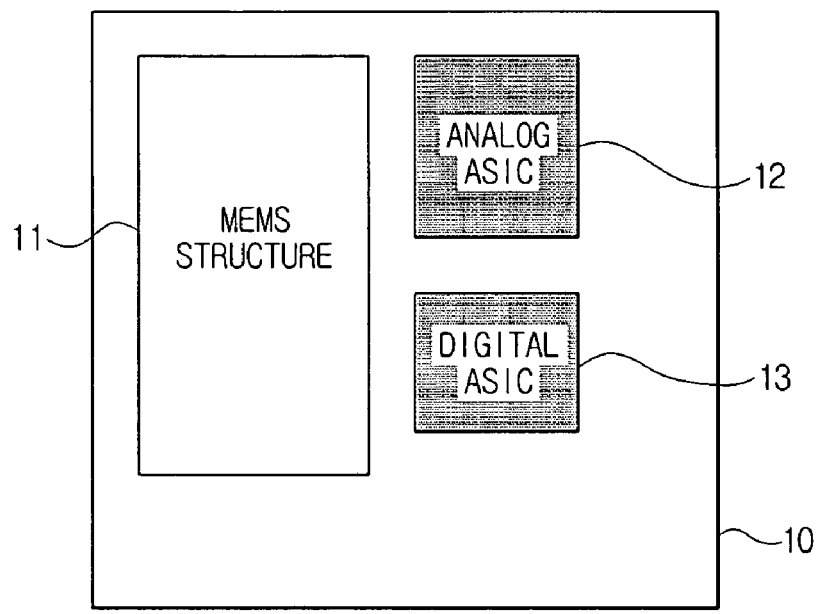
FIG. 1A is a plan view of a conventional single chip in which a plurality of structures are disposed on a plane.
Figure 1B:
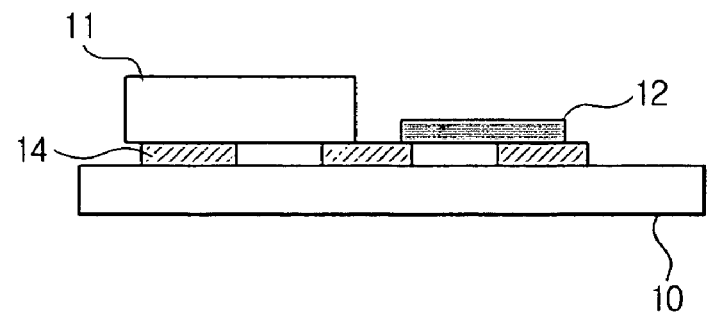
FIG. 1B is a cross-sectional view of the conventional single chip shown in FIG. 1A.
Figure 2A:
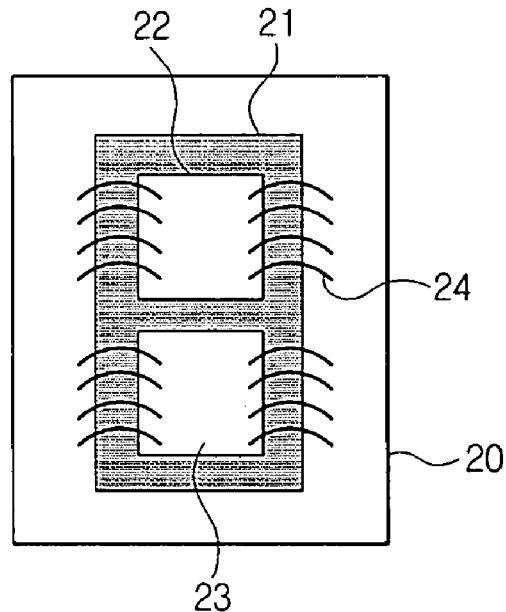
FIG. 2A is a plan view of a conventional single chip in which a plurality of structures are stacked.
Figure 2B:
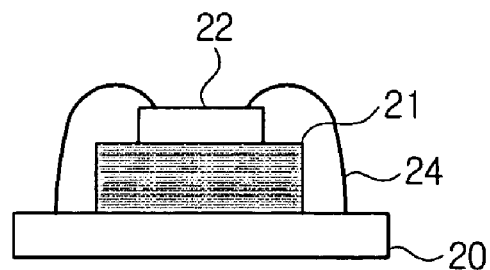
FIG. 2B is a cross-sectional view of the conventional single chip shown in FIG. 2A.

Certain embodiments of the present invention will be described in greater detail with reference to the accompanying drawings.

In the following description, the same drawing reference numerals are used for the same elements even in different drawings. Descriptions of certain items such as construction details and details of elements are only provided to assist in a comprehensive understanding of the invention. Thus, it is apparent that the present invention can be carried out without those details. Also, well-known functions or constructions are not described in detail since they would obscure the invention in unnecessary detail.

Figure 3:
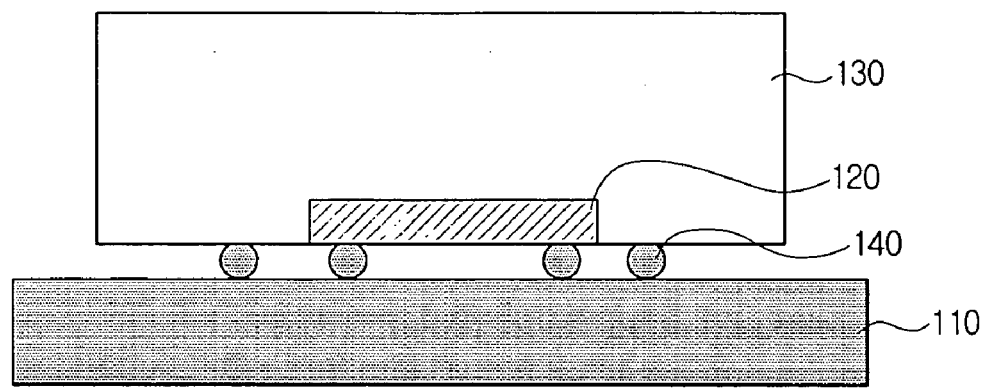
FIG. 3 is a cross-sectional view of a single chip according to an exemplary embodiment of the present invention.

FIG. 3 is a cross-sectional view of a single chip according to an embodiment of the present invention. Referring to FIG. 3, the single chip includes a substrate 110, a first element 130, a second element 120, and connectors 140.

The substrate 110 is a general printed circuit board (PCB). A predetermined area of the first element 130 is etched to from a cavity. The second element 120 is positioned in the cavity. The first element 130 and the second element 120 are electrically connected to the substrate 110 via the connectors 140. Thus, the first and second elements 130 and 120 are interconnected via electric wires (not shown) formed in the substrate 110.

The connectors 140 may be fabricated by forming external protruding connectors having sizes of tens μm to hundreds μm of gold, solder, or other metallic materials on a pad (not shown) formed on the substrate 110, i.e., conductive bumps. If the connectors 140 are fabricated using such a bumping method, a path of an electric line is shortened. Thus, electric resistance and electric noise can be reduced so as to improve electric performance.

In a case where the gyro-sensor is embodied, the first element 130 may be a structure including a mass vibrating depending on a circular angular velocity and a sensing electrode, and the second element 120 may be an analog ASIC detecting the circular angular velocity from the first element 130, a digital ASIC, or the like.

Alternatively, the first element 130 may be an analog ASIC or a digital ASIC, and the second element 120 may be a structure including a mass, a sensing electrode, and the like. Such a structure may be arbitrarily determined by a manufacturer. As shown in FIG. 3, since the second element 120 is positioned in the cavity in the first element 130, the overall size of the single chip is reduced by the size of the second element 120.

Figure 4:
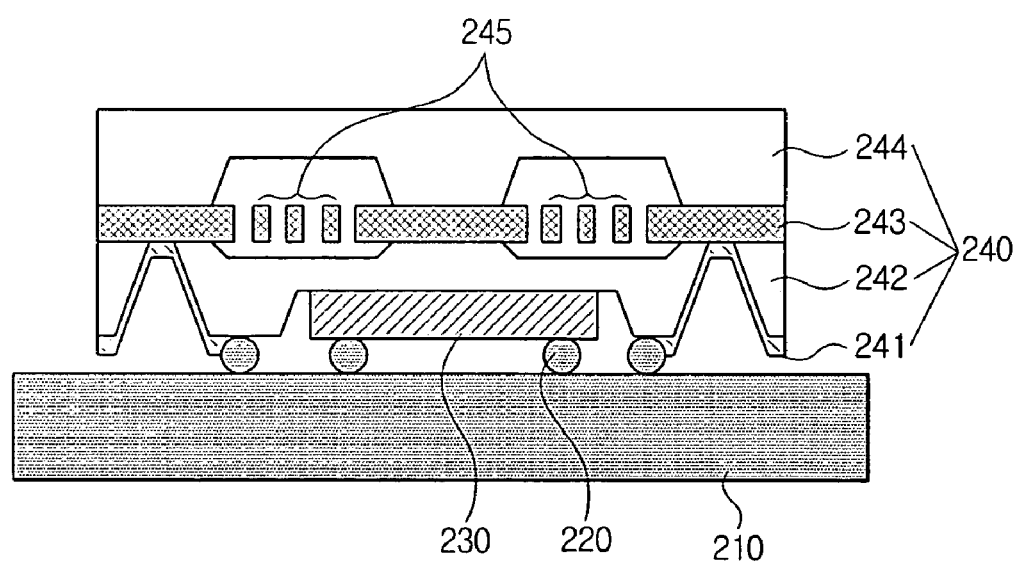
FIG. 4 is a cross-sectional view of a gyro-sensor according to an exemplary embodiment of the present invention.

FIG. 4 is a cross-sectional view of a gyro-sensor according to an embodiment of the present invention. Referring to FIG. 4, a predetermined circuit unit 230 is connected to a substrate 210 via connectors 220, and a MEMS structure 240 necessary for the gyro-sensor is positioned on the circuit unit 230. The MEMS structure 240 includes masses 245 vibrating due to a Coriolis force generated by a rotation force applied from an external source, a sensing electrode (not shown) sensing the vibration of the masses 245, and the like.

The MEMS structure 240 includes upper and lower glass substrates 244 and 242, a silicon layer 243 formed between the upper and lower glass substrates 244 and 242, and a conductive layer 241 that is an electric path connecting the silicon layer 243 to the connectors 220. The silicon layer 243 is patterned in a predetermined shape to form the masses 245 vibrating due to the external rotation force, a drive electrode driving the masses 245, the sensing electrode sensing the vibration of the masses 245, and the like. Predetermined areas of the upper and lower glass substrates 244 and 242 in which the masses 245 are formed are etched to secure predetermined spaces in which the masses 245 vibrate.

A predetermined area of the lower glass substrate 242 is etched to form a cavity in which the circuit unit 230 is positioned. As a result, the overall volume of the single chip can be reduced by the volume of the circuit unit 230.

In this case, a lower portion of the circuit unit 230 may be etched to secure a predetermined area, and then the MEMS structure 240 may be positioned in the predetermined area of the circuit unit 230.

Figure 5:
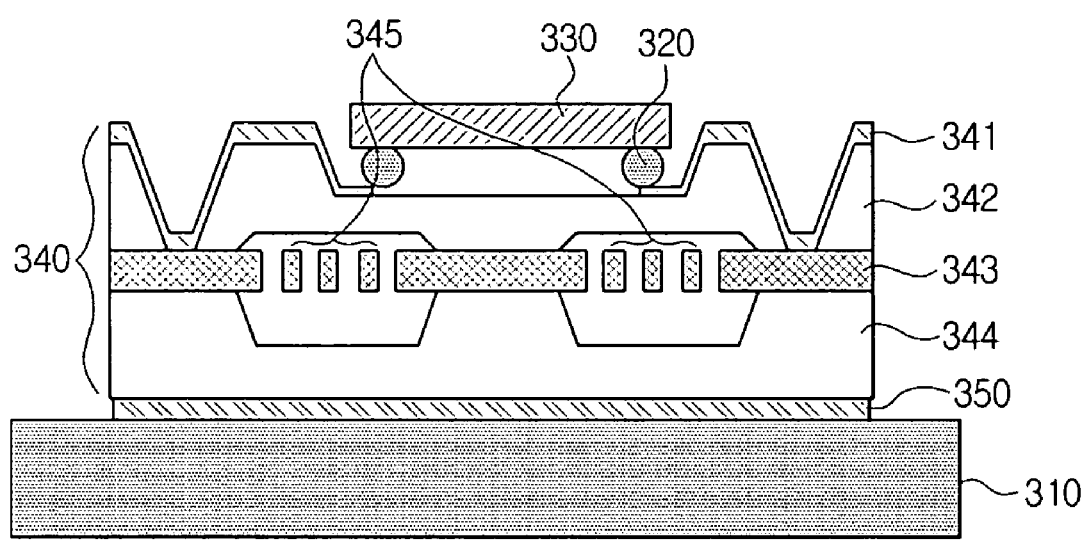
FIG. 5 is a cross-sectional view of a gyro-sensor according to another exemplary embodiment of the present invention.

FIG. 5 is a cross-sectional view of a gyro-sensor according to another embodiment of the present invention. Referring to FIG. 5, the gyro-sensor includes a substrate 310, a MEMS structure 340, and a circuit unit 330. Unlike in the previous embodiment described with reference to FIG. 4, in the present embodiment, an upper glass substrate 344 of the MEMS structure 340 is bonded to the substrate 310 using a bonding material 350 such as epoxy or the like. The circuit unit 330 is connected to a cavity formed in a lower glass substrate 342 of the MEMS structure 340 via connectors 320. As described above, the MEMS structure 340 includes masses 345 and a silicon layer 343 patterned by a sensing electrode or the like. The silicon layer 343 is electrically connected to a conductive layer 341, and the conductive layer 341 is connected to the connectors 320 so as to transmit a variation in capacitance of the MEMS structure 340 to the circuit unit 330.

Figure 6A:
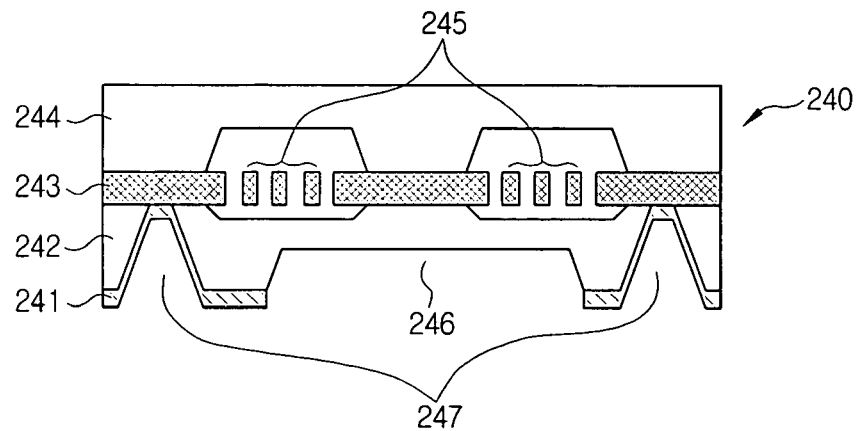
FIGS. 6A through 6C are cross-sectional views illustrating a method of fabricating the gyro-sensor shown in FIG. 4 according to an exemplary embodiment of the present invention.
Figure 6B:
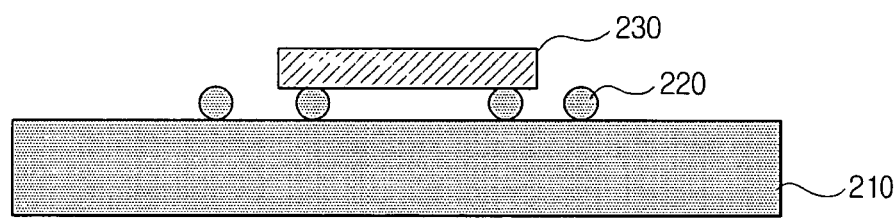
Figure 6C:
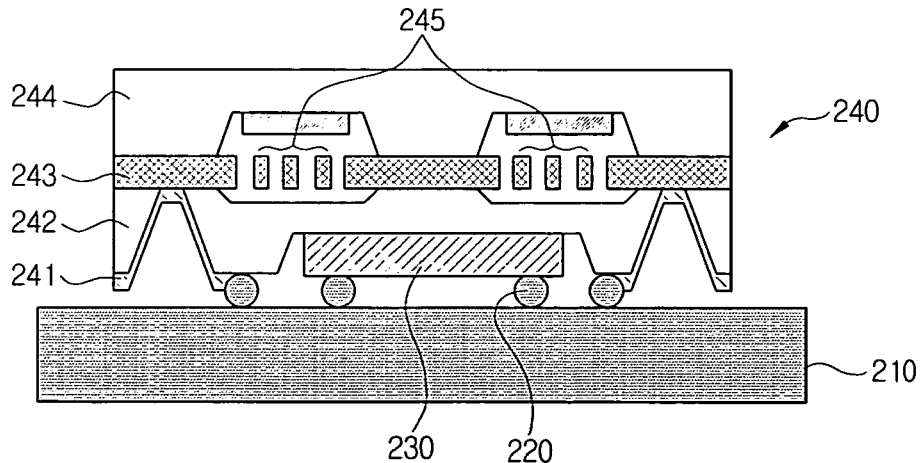

FIGS. 6A through 6C are cross-sectional views illustrating a method of fabricating the gyro-sensor shown in FIG. 4 according to an embodiment of the present invention. Referring to FIG. 6A, the MEMS structure 240 including the masses 245, the drive electrode, the sensing electrode, and the like is fabricated. In more detail, predetermined areas of a surface of the upper glass substrate 244 are etched. Next, the silicon layer 243 is bonded to the etched predetermined areas of the surface of the upper glass substrate 244 using a bonding material such as epoxy or the like. Thereafter, a photoresist layer is stacked in a predetermined pattern, and the silicon layer 243 is etched to form patterns such as the masses 245 or the like.

A surface of the lower glass substrate 242 is etched to form first and second cavities 246 and 247 in a plurality of areas of the surface of the lower glass substrate 242. The first cavity 246 in which the circuit unit 230 is to be positioned is formed to appropriate depth and area in consideration of the size of the circuit unit 230. The second cavities 247 are formed to a depth sufficient to expose the silicon layer 243. Thereafter, the conductive layer 241 is stacked on and electrically connected to the silicon layer 243.

As shown in FIG. 6B, the circuit unit 230 is electrically connected to the substrate 210. In this case, the connectors 220 are formed of conductive bumps using a bumping method to electrically connect the circuit unit 230 to the substrate 210.

As shown in FIG. 6C, the MEMS structure 240 is connected to the substrate 210 to complete the gyro-sensor. In this case, the circuit unit 230 formed above the substrate 210 is positioned in the first cavity 246 formed in the lower glass substrate 242 of the MEMS structure 240. As a result, the overall volume of the single chip can be reduced.

Figure 7A:
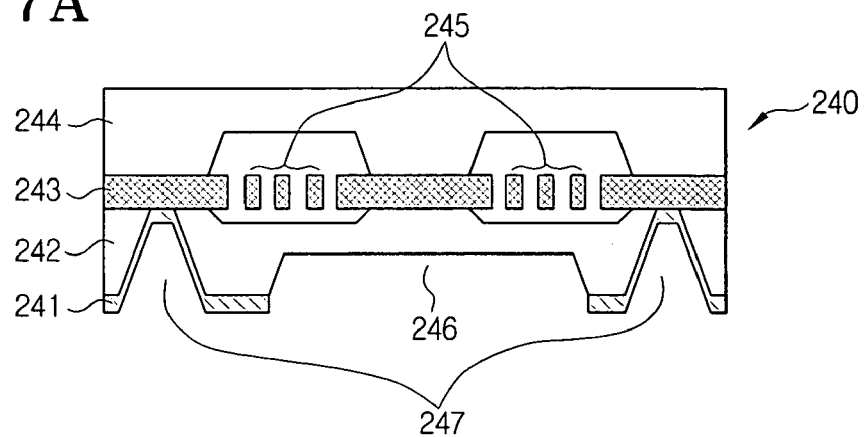
FIGS. 7A through 7C are cross-sectional views illustrating a method of fabricating the gyro-sensor shown in FIG. 4 according to another exemplary embodiment of the present invention.
Figure 7B:
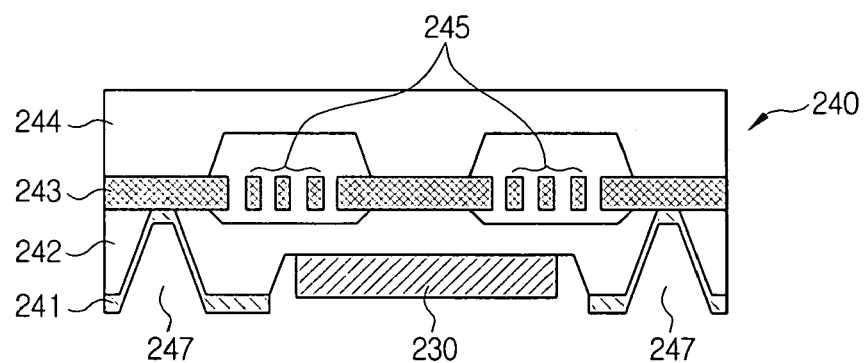
Figure 7C:
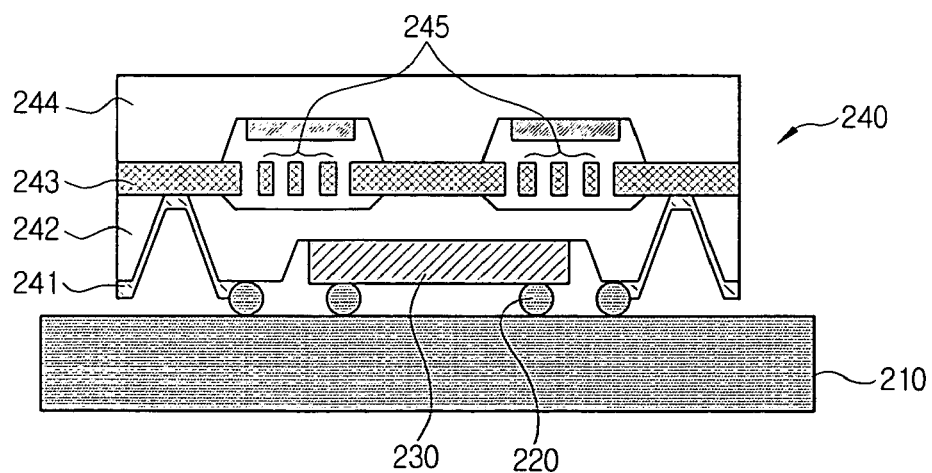

FIGS. 7A through 7C are cross-sectional views illustrating a method of the gyro-sensor according to another embodiment of the present invention. Referring to FIG. 7A, the MEMS structure 240 is fabricated using the above-described method.

As shown in FIG. 7B, the circuit unit 230 is bonded to the first cavity 246 formed in the lower glass substrate 242 of the MEMS structure 240 using the bonding material.

As shown in FIG. 7C, the MEMS structure 240 to which the circuit unit 230 is bonded is electrically connected to the substrate 210. In a case where the processes described with reference to FIGS. 7A through 7C are used, the MEMS structure 240 can be electrically connected to the substrate 210 without considering positions of the circuit unit 230 and the first cavity 246 as shown in FIG. 6C.

According to the above-described method, a gyro-sensor including the circuit unit 230 and the MEMS structure 240 can be fabricated. In this case, the circuit unit 230 may be an analog ASIC, a digital ASIC, or the like as described above.

The circuit unit 230 is fabricated on a silicon substrate. Thus, a cavity having a predetermined size may be formed in a lower surface of the silicon substrate, and the MEMS structure 240 may be positioned in the cavity. In this case, the overall volume of the gyro-sensor can be reduced by the size of the MEMS structure 240.

In the embodiment described with reference to FIG. 4 or 5, only one MEMS structure 240 or 340 and one circuit unit 230 or 330 are shown. However, a plurality of MEMS structures and a plurality of circuit units may be mounted to realize one single chip.

As described above, in a gyro-sensor including a plurality of component units and a method of fabricating the same, a plurality of circuit elements can be 3-dimensionally disposed to be packaged as a micro single chip. Thus, the overall volume of the single chip can be reduced. Also, the circuit elements are electrically interconnected using a bumping method. Therefore, electric loss can be reduced.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A gyro-sensor comprising:
   a substrate;
   a micro electro mechanical system structure comprising a surface comprising a predetermined area in which a cavity is formed and connected to an upper surface of the substrate to output a vibration signal proportional to an external rotation force; and a circuit unit positioned in the cavity, converting the vibration signal into a predetermined electric signal proportional to a circular angular velocity, and outputting the predetermined electric signal.

2. The gyro-sensor of claim 1, wherein the micro electro mechanical system structure is connected to time upper surface of the substrate so that the surface in which the cavity is formed faces the substrate.

3. The gyro-sensor of claim 2, further comprising:
connectors electrically connecting the micro electro mechanical system structure and the circuit unit to the substrate.

4. The gyro-sensor of claim 1, wherein the micro electro mechanical system structure is connected to the upper surface of the substrate so that the surface in which the cavity is formed faces a direction opposite to the substrate.

5. The gyro-sensor of claim 4, further comprising:
connectors electrically connecting the circuit unit to the cavity formed in the micro electro mechanical system structure.

6. The gyro-sensor of claim 1, wherein the circuit unit comprises:
an analog application specific integrated circuit converting the vibration signal into a predetermined analog signal proportional to the circular angular velocity; and
a digital application specific integrated circuit converting the predetermined analog signal into a digital signal.

7. The gyro-sensor of claim 1, wherein the micro electro mechanical system structure comprises;

a lower class substrate comprising a surface comprising a predetermined area in which the cavity is formed;

a silicon layer connected to a surface opposite to the surface of the lower glass substrate in which the cavity is formed and patterned in a predetermined vibration structure shape;

a conductive layer formed on the lower glass substrate to be connected to the silicon layer; and an upper glass substrate connected to the silicon layer in an opposite direction to a direction along which the lower glass substrate is connected to the silicon layer.

8. A single chip comprising:

a first element composing a surface comprising a predetermined area in which a cavity is formed, wherein the first element outputs a vibration signal proportional to an external rotation force;

a second element positioned in the cavity of the first element, wherein the second element converts said vibration signal into a predetermined electric signal proportional to a circular angular velocity; and a substrate connected to the first and second elements via conductive materials to support the first and second elements.

9. The gyro-sensor of claim 1, wherein the cavity is disposed directly opposite to said substrate.

* * * * *